United States Patent [19]
Shioyama et al.

[11] Patent Number: 6,028,629
[45] Date of Patent: Feb. 22, 2000

[54] SOLID-STATE IMAGING DEVICE AND METHOD OF MANUFACTURING THE SAME

[75] Inventors: Yoshiyuki Shioyama; Hidenori Shibata, both of Kawasaki, Japan

[73] Assignee: Kabushiki Kaisha Toshiba, Kawasaki, Japan

[21] Appl. No.: 08/829,658

[22] Filed: Mar. 31, 1997

[30] Foreign Application Priority Data

Apr. 1, 1996 [JP] Japan .................................. 8-078853

[51] Int. Cl.⁷ .......................... H04N 3/14; H01L 27/148
[52] U.S. Cl. ........................................... 348/294; 257/250
[58] Field of Search ................................... 348/294, 311, 348/315, 317; 257/222, 223, 228, 231, 249, 250, 336

[56] References Cited

U.S. PATENT DOCUMENTS

| | | | |
|---|---|---|---|
| 4,658,278 | 4/1987 | Elabd et al. | 257/249 |
| 4,799,109 | 1/1989 | Esser et al. | 257/231 |
| 5,313,081 | 5/1994 | Yamada | 257/222 |
| 5,574,294 | 11/1996 | Shepard | 257/66 |
| 5,606,187 | 2/1997 | Bluzer et al. | 257/250 |
| 5,641,700 | 6/1997 | Hawkins et al. | 257/246 |
| 5,731,601 | 3/1998 | Shioyama et al. | 257/250 |
| 5,895,944 | 4/1999 | Yamada | 257/250 |

*Primary Examiner*—Tuan Ho
*Assistant Examiner*—Luong Nguyen
*Attorney, Agent, or Firm*—Finnegan, Henderson, Farabow, Garrett & Dunner, L.L.P.

[57] ABSTRACT

In a high density solid-state imaging device, of four charge transfer electrodes formed on a semiconductor substrate via a gate insulating film, a first electrode, a fourth electrode, and a part of a second electrode are made of a first conductive film, and a third electrode and the remaining portion of the second electrode are made of a second conductive film. In the second electrode, the first conductive film is joined to the second conductive film. An oxidation film formed by thermally oxidizing the first conductive film isolates the first electrode from the second electrode, the second electrode from the third electrode, and the third electrode from the fourth electrode. The end of the second conductive film is formed so as to locate on the oxidation film on the first conductive film.

4 Claims, 11 Drawing Sheets

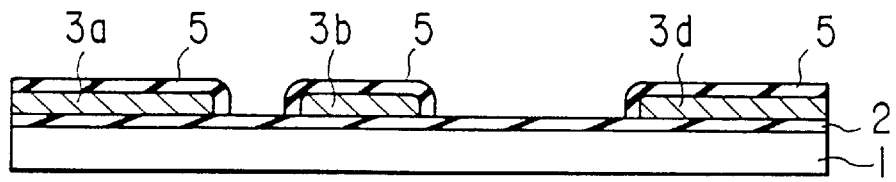
F I G. 3A
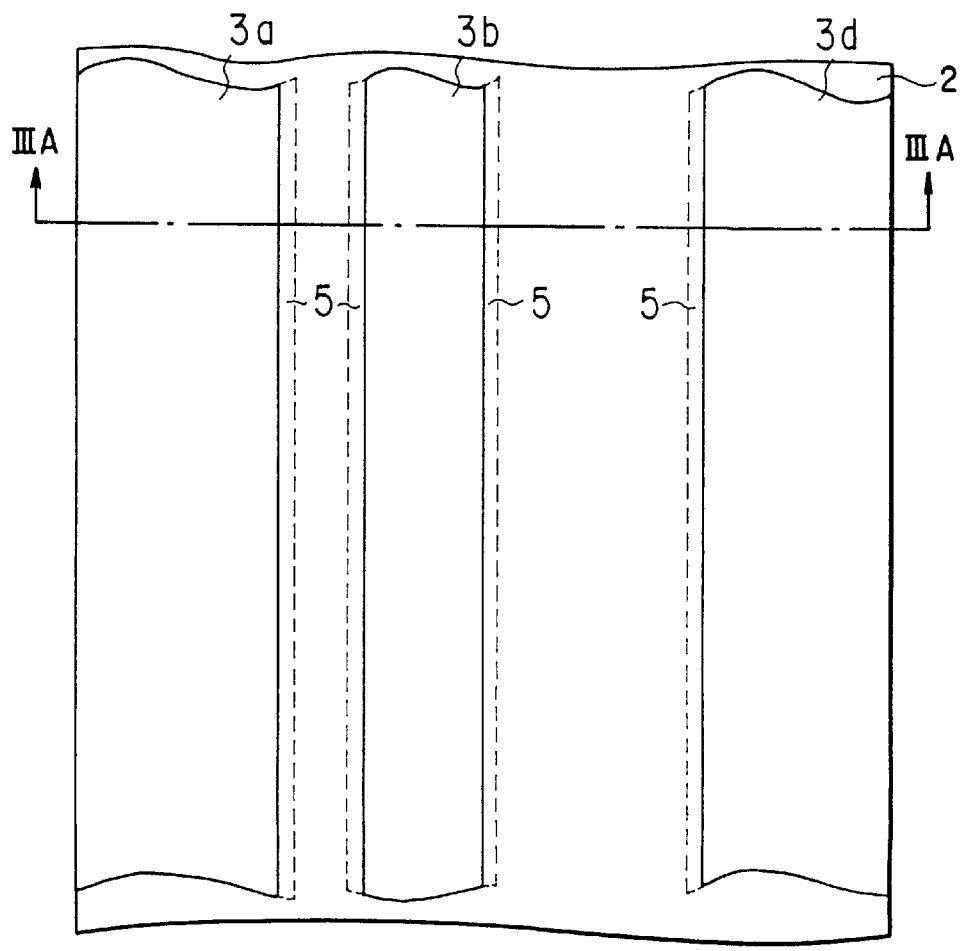
F I G. 3B

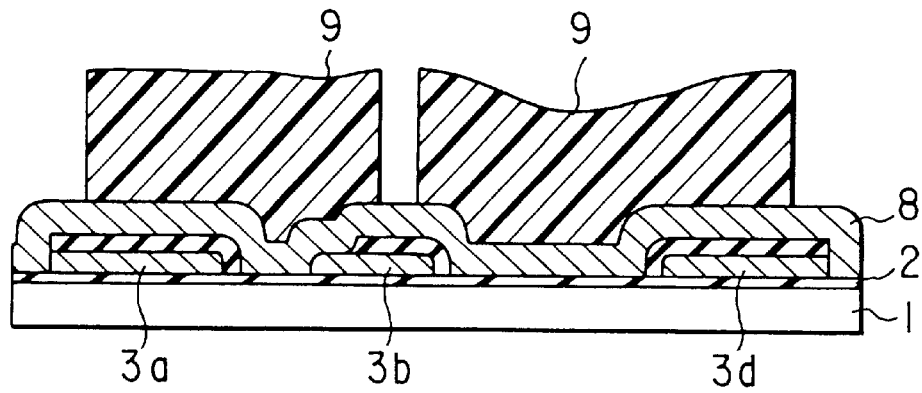
F I G. 6A
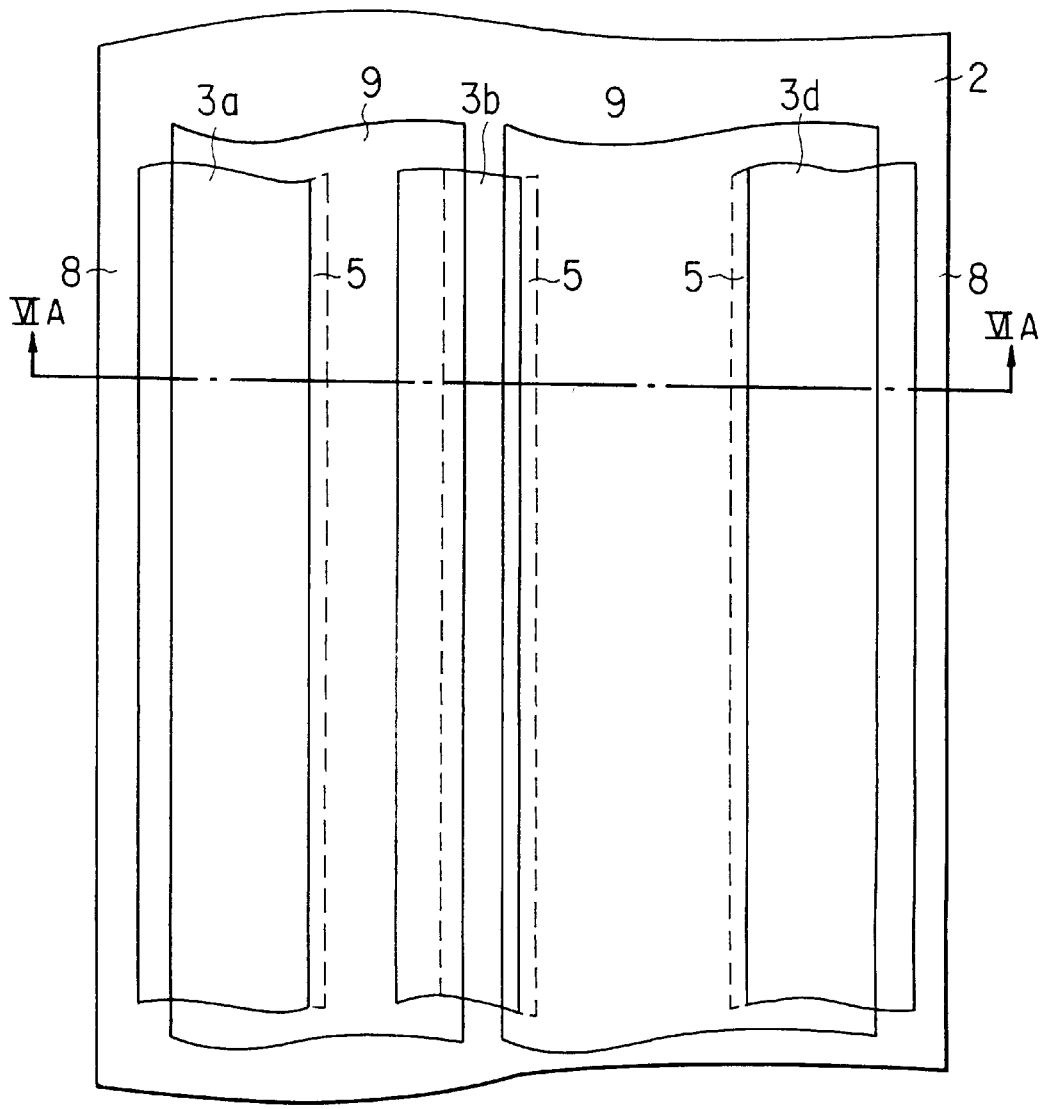
F I G. 6B

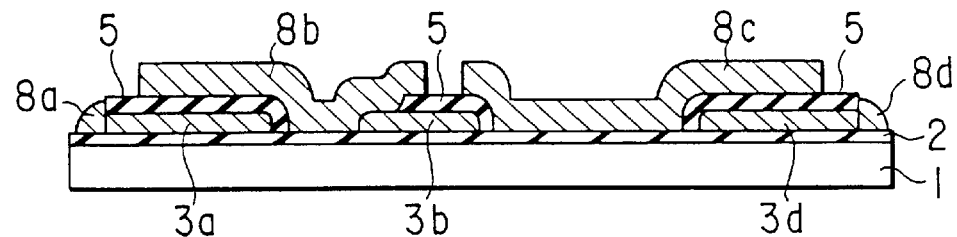
F I G. 7A
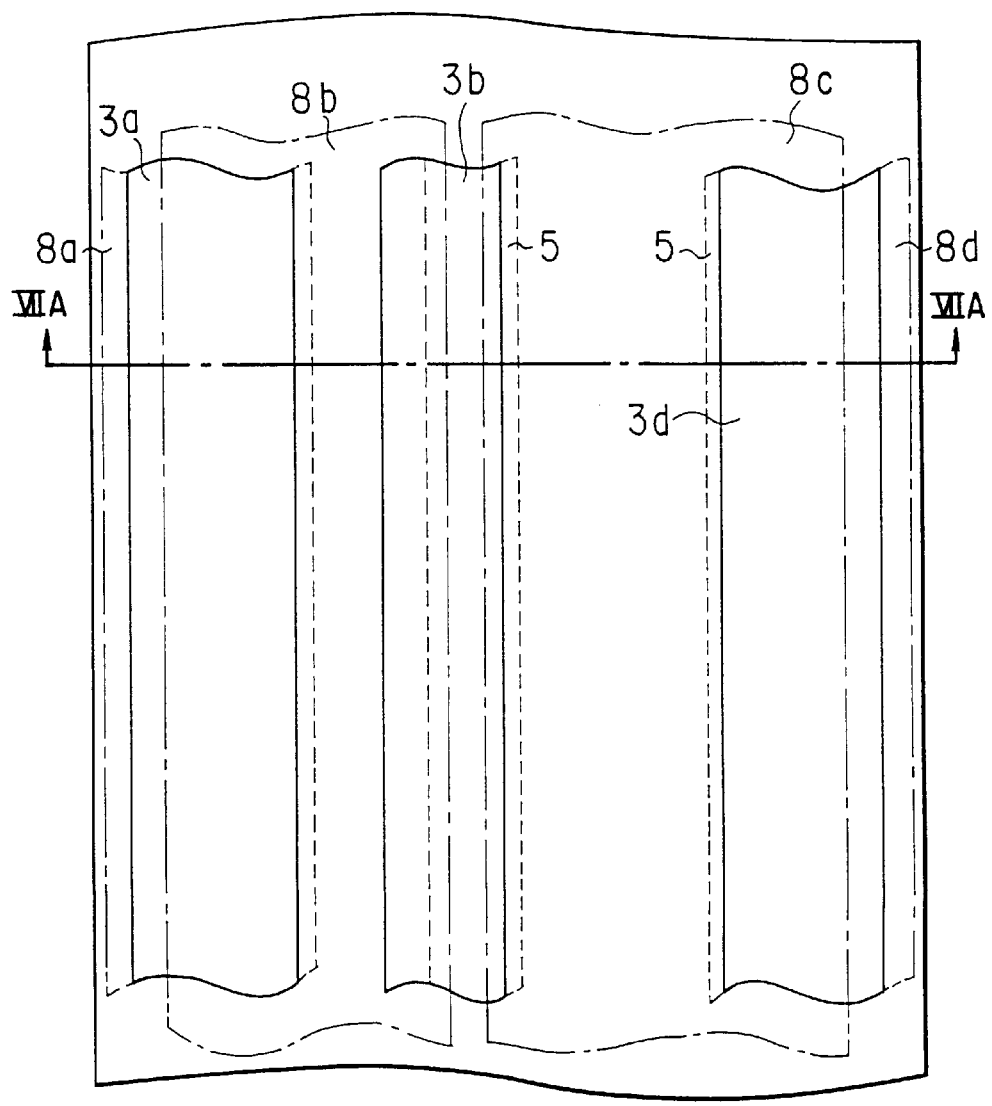
F I G. 7B

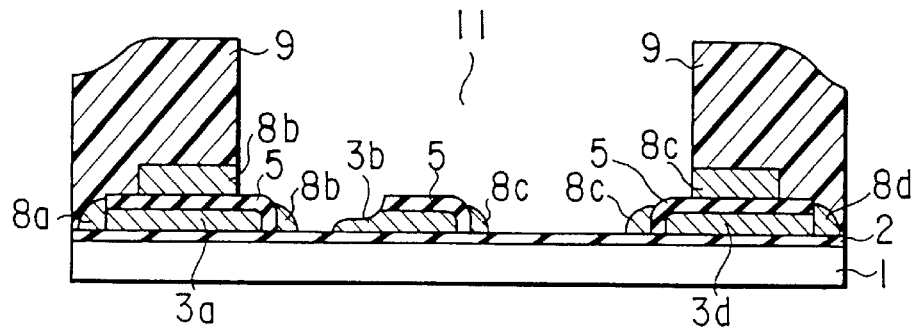
F I G. 8A
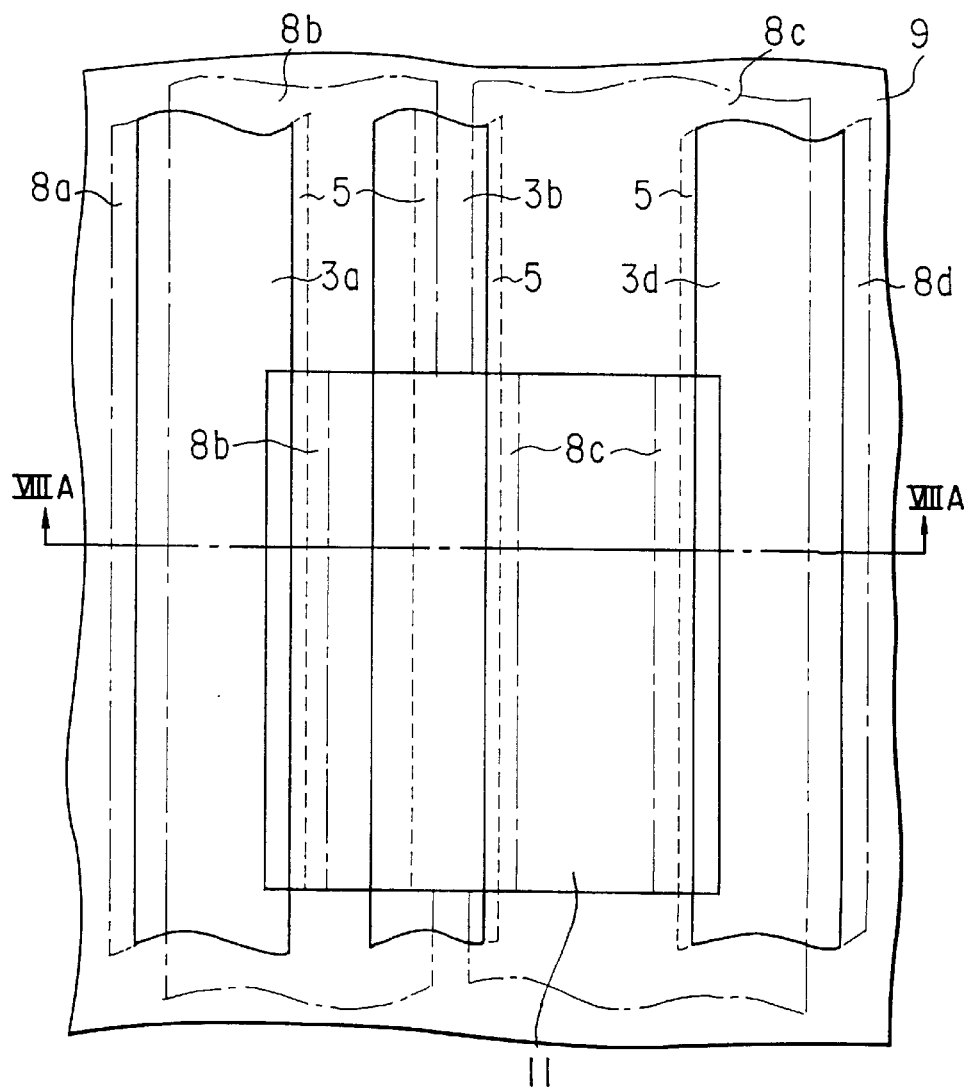
F I G. 8B

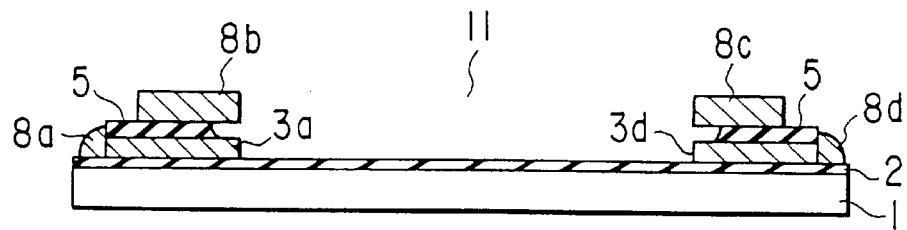
F I G. 10A
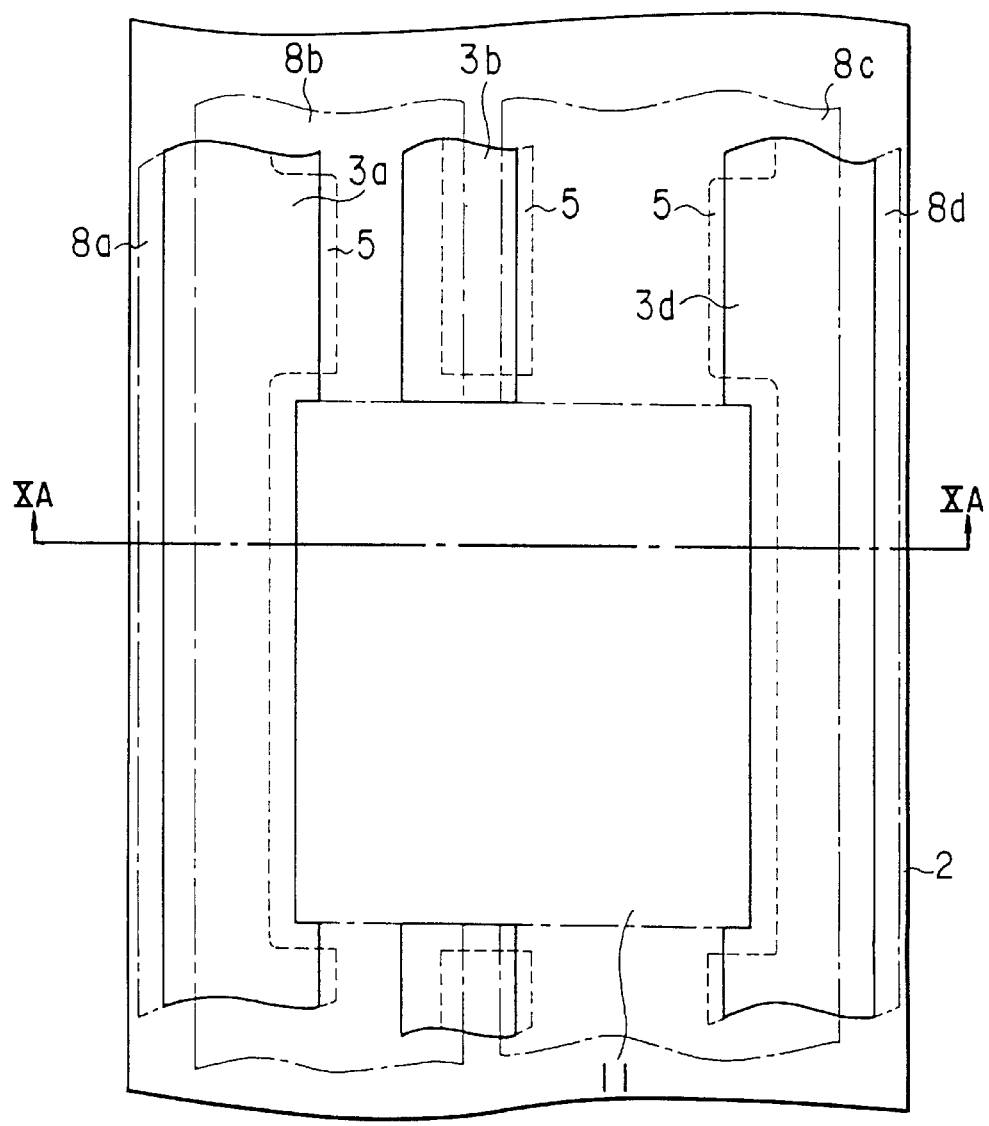
F I G. 10B

SOLID-STATE IMAGING DEVICE AND METHOD OF MANUFACTURING THE SAME

BACKGROUND OF THE INVENTION

This invention relates to a solid-state imaging device using a four-phase charge-coupled device (CCD) having four gate electrodes for a single photodiode and to a method of manufacturing the solid-state imaging device.

A CCD is a semiconductor device that has a structure where plural phase charge transfer electrodes are formed on a semiconductor channel region formed in a semiconductor substrate via a thin gate insulating film of a thickness ranging from 0.1 to 0.2 μm, for example, and that transfers a charge signal by applying pulse voltages to the plural phase charge transfer electrodes, respectively, and changing the potential of the channel region under the electrodes.

FIG. 11 shows the structure of one cell of a conventional four-phase CCD. FIG. 11A is a top view of the cell. FIG. 11B is a sectional view taken along line XIB—XIB in FIG. 11A. FIG. 11C is a sectional view taken along line XIC—XIC of FIG. 11A.

As shown in FIG. 11A, a CCD solid-state imaging device is composed of a photodiode 11 constituting a light-receiving section (pixel section) and four phase charge transfer electrodes formed in the direction of, for example, column of the photodiode 11. On the photodiode 11, the charge transfer electrodes are not formed. Between photodiodes 11 and, for example, in a region in the direction of row, charge transfer electrodes are formed via a gate insulating film 2 above a semiconductor substrate 1, thereby forming a charge transfer region as shown in FIG. 11B, where its sectional view is shown. The charge transfer electrodes formed in a region in the direction of, for example, column between photodiodes 11 constitute an interconnection layer region for supplying voltage to the individual charge transfer electrodes in the charge transfer region as shown in FIG. 11C, where its sectional view is shown. Although not shown, on the regions except for the light-receiving section, a shading film is formed of a metal layer film made of, for example, Al.

The charge transfer electrodes shown in the figure are formed of three layers of polysilicon film: a first charge transfer electrode is made of a first-layer polysilicon film; a second and fourth-layer charge transfer electrodes are made of a second-layer polysilicon film, and a third charge transfer electrodes is made of a third-layer polysilicon film. The individual charge transfer electrodes are isolated from each other by an oxide film. The oxide film is formed by patterning the polysilicon film of each layer using, for example, lithography and etching techniques and by thereafter oxidizing the patterned polysilicon layer.

To form an oxide film for isolating the individual charge transfer electrodes from each other as described above, it is necessary to pattern each polysilicon film separately. This approach therefore requires mating margins for patterning in processing each layer, which makes it difficult to subminiaturize cells. Furthermore, to secure the mating margins, the area of a photodiode 11 is reduced, leading to the problem of lowering the sensitivity.

As shown in FIG. 11C, in the interconnection layer region, three layers of polysilicon films are stacked one on top of another, so the step height between the interconnection layer region and the photodiode region 11 is large. In forming a shading film, this prevents the shading film from being formed sufficiently over the step portion and therefore light may enter the regions other than the photodiode 11, causing an erroneous signal.

In contrast, there is a method of thickening a shading film so that the shading film may be formed sufficiently even at the step portion. With this method, however, when the shading film on the photodiode region 11 is etched away, it is difficult to etch the film away sufficiently. Because the shading film is formed thicker in the periphery of the photodiode region 11, the amount of light reaching the photodiode 11 is smaller, lowering the sensitivity of the solid-state imaging device. For this reason, it is desirable that the thickness of the shading film should not be made thicker.

Moreover, since it is necessary to form and process three layers of polysilicon film, the processes are long and complex.

As described above, with the conventional solid-state imaging device and method of manufacturing the device, since the charge transfer electrodes are composed of three layers of polysilicon films, the step height between a region where three layers of polysilicon films are stacked one on top of another, such as an interconnection layer region, and the photodiode region is large, which prevents a shading film from covering the step portion sufficiently, resulting in the problem of permitting light to enter the regions other than the photodiode, thus causing an erroneous signal.

Furthermore, because the three layers of polysilicon films must be patterned separately, it is necessary to secure mating margins for patterning, leading to the problem of making it difficult to subminiaturize cells.

In addition, because it is necessary to process the three layers of polysilicon films, this results in the problem of making the manufacturing processes long and complex.

BRIEF SUMMARY OF THE INVENTION

The object of the present invention is to provide a high-density solid-state imaging device which can suppress the generation of erroneous signals by reducing the step height between the interconnection region and the charge transfer electrode region and photodiode region and whose manufacturing processes are simple, and a method of manufacturing the solid-state imaging device.

The foregoing object is accomplished by providing a solid-state imaging device comprising: a plurality of light-receiving elements formed on a semiconductor substrate; and a set of four charge transfer electrodes that are formed via a gate insulating film in the regions between the light-receiving elements and that are applied with four different pulse signals, the set of four charge transfer electrodes being arranged repeatedly, wherein a first charge transfer electrode, a fourth charge transfer electrode, and part of a second charge transfer electrode in the set of charge transfer electrodes are made of a first conductive film, a third charge transfer electrode and the remaining portion of the second charge transfer electrode in the set of charge transfer electrodes are made of second conductive film, the first conductive film is joined to the second conductive film in the second charge transfer electrode, an oxide film formed by thermally oxidizing the first conductive film isolates the first charge transfer electrode from the second charge transfer electrode, the second charge transfer electrode from the third charge transfer electrode, and the third charge transfer electrode from the fourth charge transfer electrode, and the end of the second conductive film is formed so as to locate on the oxide film on the first conductive film.

The solid-state imaging device may further comprise a first conductive material portion formed of the second conductive film joined to the sidewall of the first charge transfer electrode in a set of charge transfer electrodes adjacent to the fourth charge transfer electrode; and a second conductive material portion formed of the second conductive film joined to the sidewall of the fourth charge transfer electrode in a set of charge transfer electrodes adjacent to the first charge transfer electrode.

In the solid-state imaging device, the first and second conductive films may be made of a polysilicon film.

The foregoing object is also accomplished by providing a method of manufacturing solid-state imaging devices, comprising: the step of forming a gate insulating film on a semiconductor substrate; the step of forming a first conductive film on the gate insulating film; the step of removing the first conductive film in part of a second charge transfer electrode region and in a third charge transfer electrode region so that the first conductive film may have a strip pattern; the step of thermally oxidizing the surface of the remaining first conductive film; the step of removing, on the first charge transfer electrode region side, part of a thermal oxidation film formed in the thermal oxidation process on the first conductive film constituting part of the second charge transfer electrode; the step of removing the thermal oxidation film in the region between the fourth charge transfer electrode and the first charge transfer electrode in a set of charge transfer electrodes adjacent to the fourth charge transfer electrode and the first conductive film so that they may have a strip pattern; the step of forming a second conductive film; the step of forming a first to fourth strip charge transfer electrodes by removing the second conductive film using as a mask a first resist film having an opening on part of the insulating film parallel with and partially overlapping with the first strip conductive film and remaining on the second charge transfer electrode and on the region between the fourth charge transfer electrode and the first charge transfer electrode in a set of charge transfer electrodes adjacent to the fourth charge transfer electrode; and the step of removing the second conductive film, the thermal oxidation film, and the first conductive film using as a mask a second resist film having an opening on a light-receiving element region on the first to fourth strip charge transfer electrodes.

In the method of manufacturing solid-state imaging devices, the step of forming a first to fourth strip charge transfer electrodes by removing the second conductive film may include the step of etching the second conductive film using anisotropic etching techniques.

As described above, with the solid-state imaging device of the present invention, because the four charge transfer electrodes to which four different pulse signals are applied are made of the first and second layer conductive films, the step heights due to the charge transfer electrodes are reduced as compared with a conventional equivalent where the charge transfer electrodes were made of three layers of conductive films. This makes it possible to form a shading film at a high covering rate, which helps prevent light from entering the regions other than the light-receiving region, thus avoiding the generation of erroneous signals.

Because the thermal oxidation film of the first conductive film, which is generally excellent in insulation, isolates the first charge transfer electrode from the second charge transfer electrode, the second charge transfer electrode from the third charge transfer electrode, and the third charge transfer electrode from the fourth charge transfer electrode, it is possible to isolate the charge transfer electrodes from each other reliably.

Because the distance between the charge transfer electrodes on the channel region through which charges are transferred is determined by the thickness of the thermal oxidation film, the distance between the charge transfer electrodes can be made constant. This makes it easy to set the impurity concentration distribution in the channel region.

Furthermore, because the distance between the charge transfer electrodes can be made smaller than the minimum dimension the lithography process will allow, the transfer efficiency of charges can be improved.

Since the end of the second conductive film is formed so as to locate on the oxide film on the first conductive film, there is no need of securing mating margins in the lithography process, which helps reduce the area of cells and form a highly integrated solid-state imaging device. When the cell area is not reduced, the area of the light-receiving element can be increased, improving the sensitivity of the solid-state imaging device.

With the solid-state imaging device of the present invention where the first conductive material portion is formed of the second conductive film joined to the sidewall of the first charge transfer electrode in a set of charge transfer electrodes adjacent to the fourth charge transfer electrode and the second conductive material portion is formed of the second conductive film joined to the sidewall of the fourth charge transfer electrode in a set of charge transfer electrodes adjacent to the first charge transfer electrode, because the first conductive material portion is joined to the fourth charge transfer electrode and the second conductive material portion is joined to the first charge transfer electrode, these conductive material portions function as the fourth or first charge transfer electrode. Namely, this produces the same effect of the fourth or first charge transfer electrode being extended. This enables the conductive material portions to shorten the distance between adjacent sets of charge transfer electrodes, thereby making the distance smaller than the minimum dimension the lithography process will allow. This helps improve the transfer efficiency of charges.

With the solid-state imaging device of the present invention where the first and second conductive films are formed of polysilicon films, an insulating film excellent in insulation can be formed by thermally oxidizing the polysilicon film constituting the first conductive film.

With the method of manufacturing solid-state imaging devices according to the present invention, the first to fourth charge transfer electrodes are formed of the first and second conductive films formed on the semiconductor substrate via the gate insulating film. By forming the charge transfer electrodes of two layers of conductive films this way, the step heights due to the charge transfer electrodes can be reduced as compared with a conventional equivalent where the charge transfer electrodes were made of three layers of conductive films.

Because the first conductive film is processed so as to have a strip pattern and the second conductive film is formed after the processed first conductive film is thermally oxidized, the first conductive film can be isolated from the second conductive film by the thermal oxidation film of the first conductive film.

Because the first conductive film is isolated from the second conductive film by the thermal oxidation film of the first conductive film and the second conductive film is processed so as to overlap with the first conductive film, the distance between the charge transfer electrodes on the channel region is determined by the thickness of the thermal oxidation film, which enables the distance to always remain constant. Moreover, the distance can be made smaller than the minimum dimension the lithography process will allow.

The length of each of the charge transfer electrodes on the channel region is influenced only by the lithography process in processing the first conductive film, but not by the other lithography processes. This prevents the length of each charge transfer electrode from varying with the mating accuracy of the lithography processes. As a result, the characteristic of transferring charges can be stabilized.

After the first to fourth charge transfer electrodes are formed by processing the first and second conductive films into a strip pattern, the second conductive film, thermal oxidation film, and first conductive film are removed using as a mask a resist film having an opening on the light-receiving element region, which eliminates the necessity for the mating margins for patterning, unlike a conventional manufacturing method where each conductive film on the light-receiving element region was removed by separate patterning. This reduces the area of cells, helping producing a highly integrated solid-state imaging device. When the cell area is not reduced, the area of the light-receiving element can be increased, improving the sensitivity of the solid-state imaging device.

With a conventional manufacturing method, the first to fourth charge transfer electrodes were formed of three layers of conductive films. Therefore, it was difficult to make an opening on the light-receiving element region by etching the three layers of conductive films and the insulating films between the layers using the same resist film as a mask after processing the three layers of conductive films into a strip pattern, because the resistance of the resist film might not be sufficient. In contrast, with the manufacturing method of the present invention, because two layers of conductive films are used to form the first to fourth charge transfer electrodes, an opening can be made easily on the light-receiving region by etching the first and second conductive films and the insulating film between them using the same resist as a mask.

Furthermore, with the method of manufacturing solid-state imaging devices according to the present invention, in the step of removing the second conductive film to form the first to fourth strip charge transfer electrodes, since anisotropic etching is performed using as a mask the first resist film having an opening on part of the insulating film parallel to and partly overlapping with the first strip conductive film and remaining on the second charge transfer electrode and on the region between the fourth charge transfer electrode and the first charge transfer electrode in a set of charge transfer electrodes adjacent to the fourth charge transfer electrode, the second conductive film remains on the sidewalls of the fourth charge transfer electrode and first charge transfer electrode in the region between the fourth charge transfer electrode and the first charge transfer electrode adjacent to the fourth charge transfer electrode, thereby enabling a conductive material portion to be formed of the remaining second conductive film. Therefore, the conductive material portion makes the distance between the fourth charge transfer electrode and the first charge transfer electrode smaller than the minimum dimension the lithography process will allow. As a result, the transfer efficiency of charges can be improved.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are a sectional view and top view to help explain the method of the manufacturing solid-state imaging device according to the embodiment of the present invention;

FIGS. 6A and 6B are a sectional view and top view to help explain the method of the manufacturing solid-state imaging device according to the embodiment of the present invention;

FIGS. 7A and 7B are a sectional view and top view to help explain the method of the manufacturing solid-state imaging device according to the embodiment of the present invention;

FIGS. 8A and 8B are a sectional view and top view to help explain the method of the manufacturing solid-state imaging device according to the embodiment of the present invention;

FIGS. 10A and 10B are a sectional view and top view to help explain the method of the manufacturing solid-state imaging device according to the embodiment of the present invention.

DETAILED DESCRIPTION OF THE INVENTION

Hereinafter, referring to the accompanying drawings, an embodiment of the present invention will be explained.

Figure 1A:
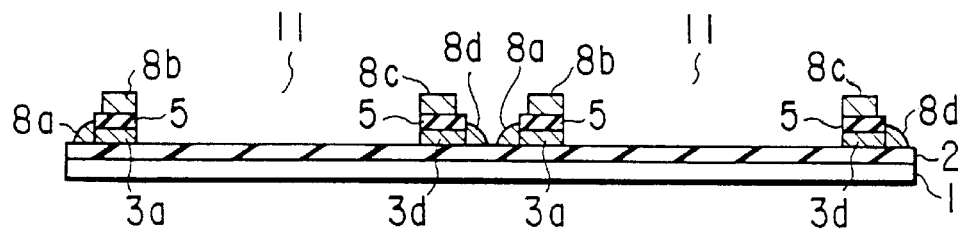
FIGS. 1A to 1C are sectional views and top view of a solid-state imaging device of an embodiment according to the present invention.
Figure 1B:
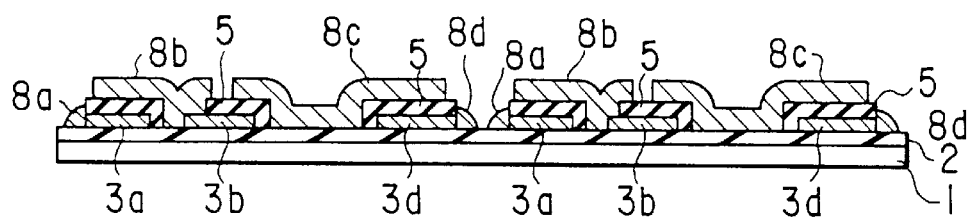
Figure 1C:
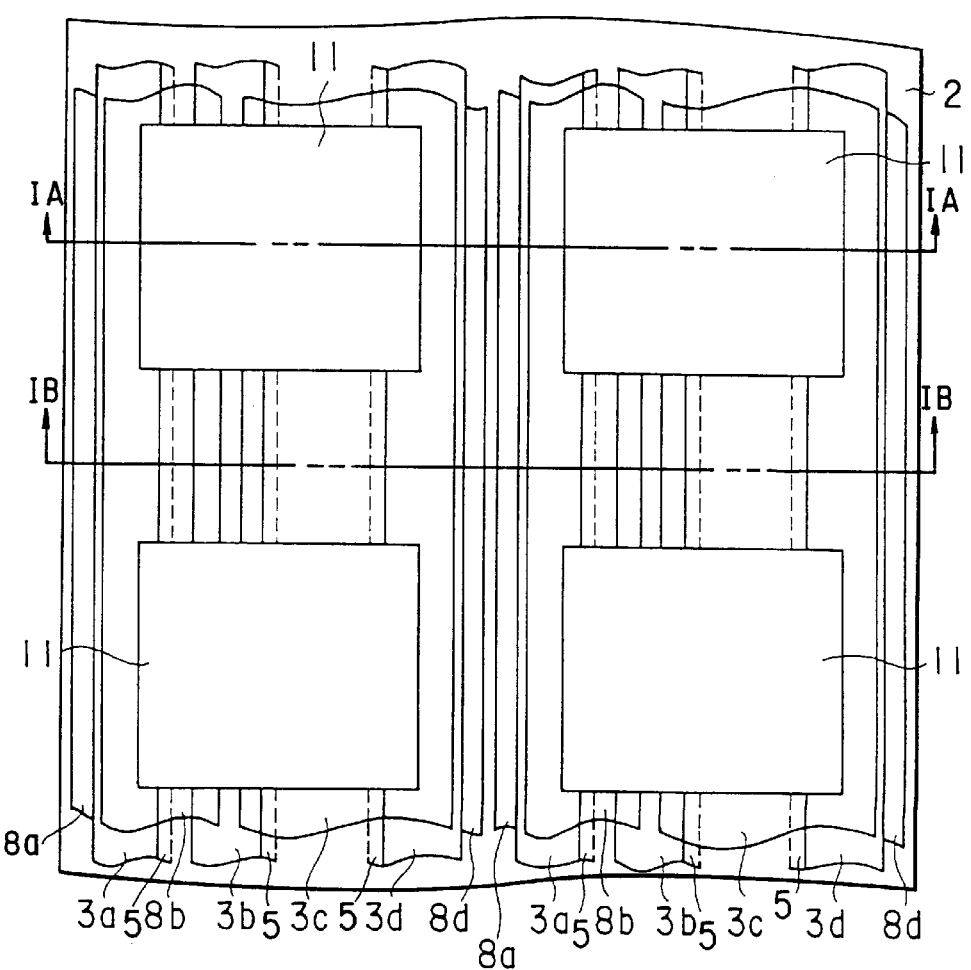

FIGS. 1A to 1C are sectional views and top view of a solid-state imaging device according to an embodiment of the present invention. FIG. 1C is a top view of the solid-state imaging device of the present embodiment. FIG. 1A is a sectional view of the solid-state imaging device taken along line 1A—1A in FIG. 1C. FIG. 1B is a sectional view of the solid-state imaging device taken along line 1B—1B in FIG. 1C.

Figure 11A:
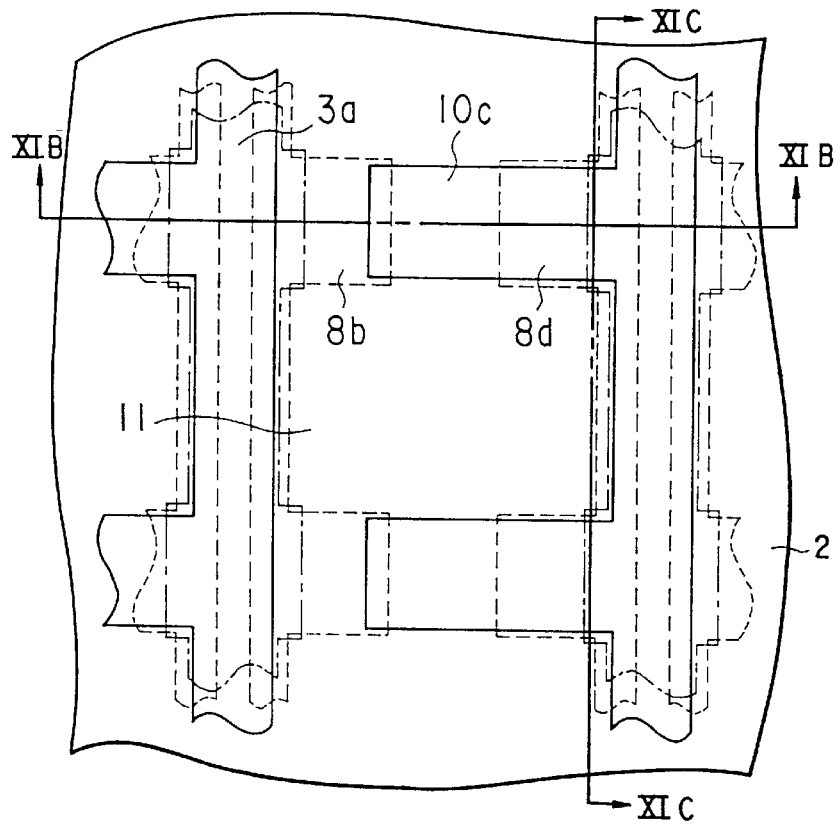
FIGS. 11A to 11C are a top view and sectional views of a conventional solid-state imaging device.
Figure 11B:
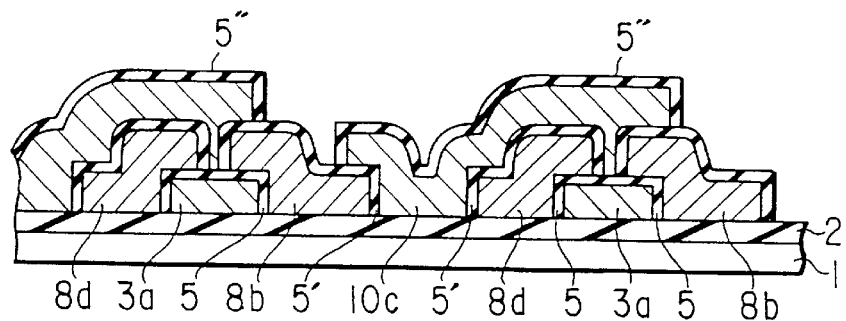
Figure 11C:
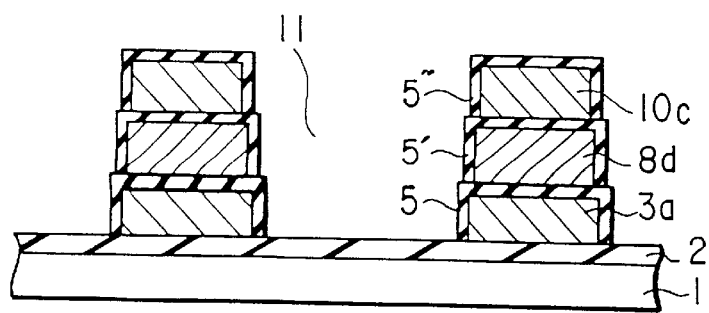

In FIGS. 1A to 1C, a shading film is not shown as in FIGS. 11A to 11C showing a conventional equivalent.

The CCD solid-state imaging device according to the embodiment, like the conventional one, comprises a photodiode 11 constituting a light-receiving section (pixel section) and four phase charge transfer electrodes formed in the direction of, for example, column of the photodiode 11. On the photodiode 11, the charge transfer electrodes are not formed. Between photodiodes 11 and, for example, in a region in the direction of row, charge transfer electrodes are formed via a gate insulating film 2 above a semiconductor substrate 1, thereby forming a charge transfer region as shown in FIG. 1B, where its sectional view is shown. The charge transfer electrodes formed in a region in the direction of, for example, column between photo-diodes 11 constitute an interconnection layer region for supplying voltage to the individual charge transfer electrodes in the charge transfer region.

The CCD solid-state imaging device of the embodiment is provided with a first to fourth charge transfer electrodes as a conventional equivalent, but differs from the conventional equivalent whose four phase charge transfer electrodes were made of three layers of polysilicon films in that the four phase charge transfer electrodes are composed of two layers of polysilicon films. As shown in FIG. 1B, the first charge transfer electrode is composed of a first layer polysilicon film portion 3a and a sidewall polysilicon film 8a formed by forcing the second layer polysilicon film to remain on the sidewall of the polysilicon film 3a. The second charge transfer electrode is composed of the first polysilicon film portion 3b and the second layer polysilicon film portion 8b formed so as to connect to the polysilicon film portion 3b. The third charge transfer electrode is made of the second polysilicon film portion 8c. The fourth charge transfer electrode is composed of the first polysilicon film portion 3d and a sidewall polysilicon film 8d formed by forcing the second layer polysilicon film to remain on the sidewall of the polysilicon film 3d.

As described above, with the embodiment, because the four phase charge transfer electrodes are composed of two layers of polysilicon films, the step heights due to the charge transfer electrodes are reduced as compared with the conventional equivalent whose charge transfer electrodes were composed of three layers of polysilicon films. This makes it possible to form a shading film at a great covering rate on the sidewall surface of an opening made to expose the photodiode region 11, which prevents light from entering the regions other than the photodiode region 11 and therefore avoids the generation of erroneous signals due to such entering light.

Furthermore, because the distance between the photodiode region 11 and a lens for gathering rays of light on the photodiode 11 is shortened, the loss of light is decreased, improving the sensitivity of the solid-state imaging device.

Moreover, with the embodiment, for pairs of adjacent charge transfer electrodes (i.e., the first charge transfer electrode portion 3a and second charge transfer electrode portion 8b, the second charge transfer electrode 3b and third charge transfer electrode 8c, and the third charge transfer electrode 8c and fourth charge transfer electrode portion 3d) in each cell, one charge transfer electrode is made of the first layer polysilicon film and the other is made of the second layer polysilicon film so that one may overlap with the other. One charge transfer electrode is isolated from the other by a thermal oxidation film 5 formed by thermally oxidizing the first polysilicon film.

This makes it possible to make the distance between the charge transfer electrodes at the interface with the gate insulating film 2 smaller than the minimum dimension the lithographic process will allow. By shortening the distance between the adjacent charge transfer electrodes like this, the transfer efficiency of charges in the channel region can be improved. Because the distance is determined by the thickness of the thermal oxidation film 5, the distance can be made constant. This makes it possible to easily set the impurity concentration distribution in the channel region.

Furthermore, since the insulating properties of the thermal oxidation film are better than those of an insulating film formed by a deposition method, it is possible to prevent short circuit from taking place between the charge transfer electrodes.

Still furthermore, the present embodiment is characterized in that on the sidewalls of the first layer polysilicon film portions 3d and 3a constituting the fourth charge transfer electrode and first charge transfer electrode, respectively, the sidewall polysilicon films 8d and 8a are formed of the second layer polysilicon film. With this structure, the distance between the fourth charge transfer electrode and first charge transfer electrode adjacent to each other can be made smaller than the minimum dimension the lithographic process will allow. Consequently, as described earlier, the transfer efficiency of charges in the channel region can be improved.

Next, a method of manufacturing such a solid-state imaging device will be described by reference to FIGS. 2A to 10B. Although FIGS. 1A to 1C show four cells, FIGS. 2A to 10B show a single cell. FIGS. 2B, 3B, 4B, 5B, 6B, 7B, 8B, 9B, and 10B are top views. FIGS. 2A, 3A, 4A, 5A, 6A, 7A, 8A, 9A, and 10A are sectional views of the semiconductor structure taken along line IIA—IIA, IIIA—IIIA, IVA—IVA, VA—VA, VIA—VIA, VIIA—VIIA, VIIIA—VIIIA, IXA—IXA, and XA—XA of FIGS. 2B, 3B, 4B, 5B, 6B, 7B, 8B, 9B, and 10B, respectively. The first to fourth charge transfer electrode regions constituting four phase charge transfer electrodes are arranged from left to right in each of those figures.

Figure 2A:
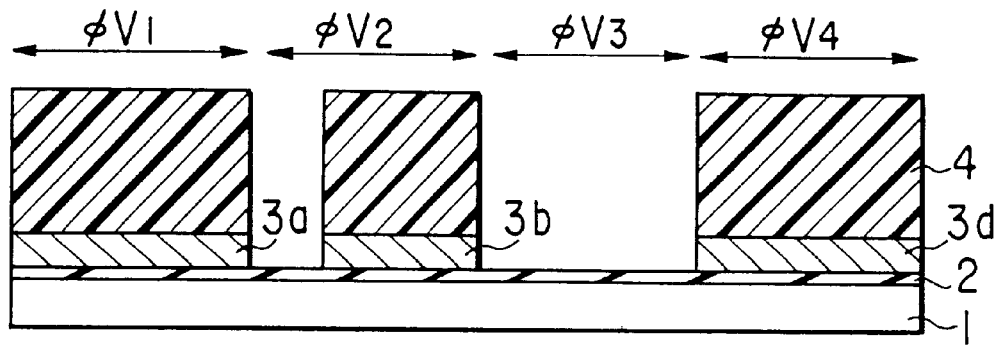
FIGS. 2A and 2B are a sectional view and top view to help explain a method of manufacturing the solid-state imaging device according to the embodiment of the present invention.
Figure 2B:
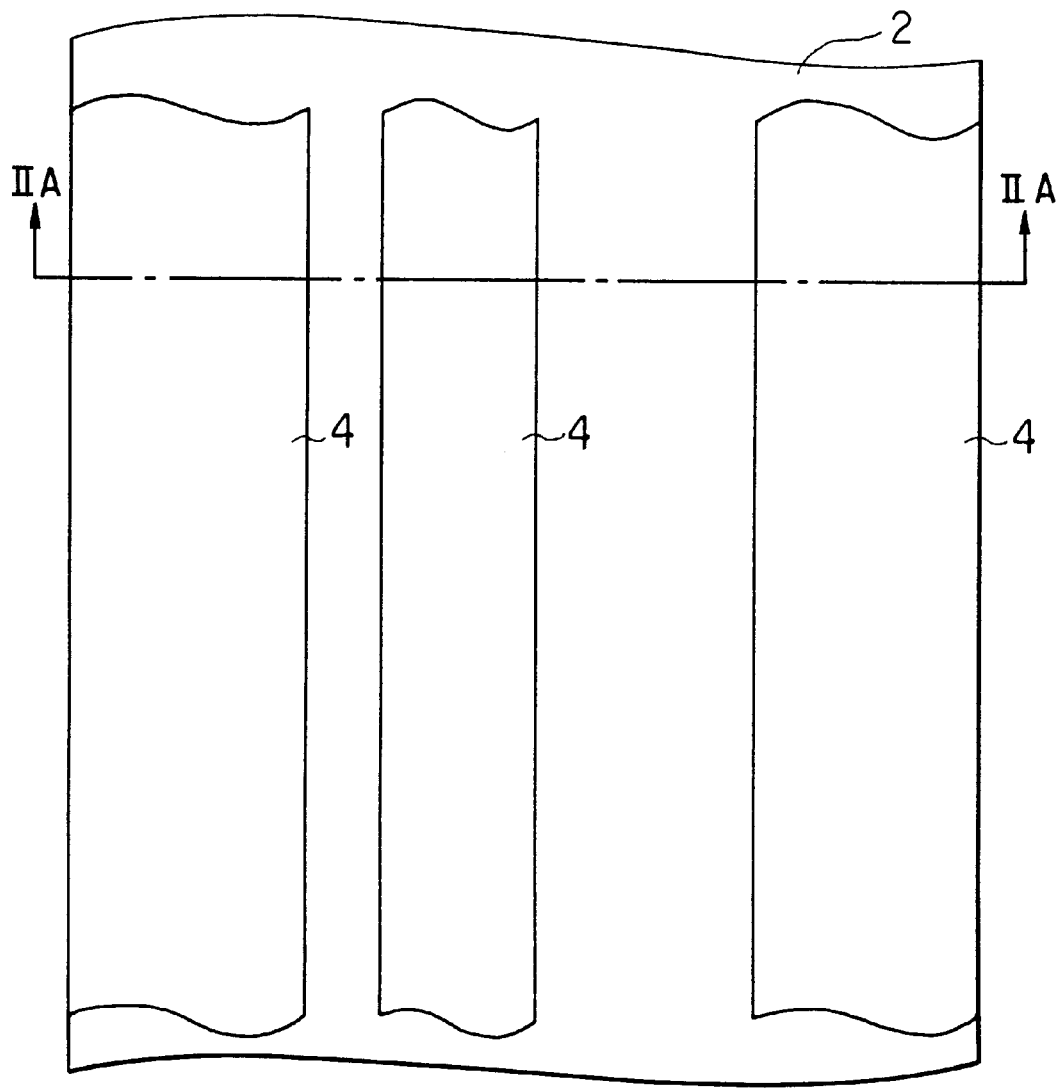

First, on a semiconductor substrate 1, a gate insulating film 2 made of an insulating film, such as an oxide film or a nitride film, is formed. Then, on the insulating film, a first layer polysilicon film 3 of, for example, 400 to 500 nm thick is formed. Next, on the polysilicon film 3, a resist film 4 with a strip pattern as shown in FIG. 2B is formed. With the resist film 4 as a mask, the polysilicon film 3 is etched (FIG. 2A). Unlike a conventional solid-state imaging device manufacturing method in which the polysilicon film on the photodiode region 11 is removed in processing the polysilicon film of each layer, the present embodiment performs processing only in the direction of the interconnection region without removing the polysilicon film 3 on the photodiode region 11. Moreover, a first charge transfer electrode 3a, a part 3b of a second charge transfer electrode, and a fourth charge transfer electrode 3d are formed of the first layer polysilicon film 3.

Next, as shown in FIGS. 3A and 3B, on the surfaces of the processed polysilicon films 3a, 3b, and 3d, an oxide film 5 of, for example, about 0.2 μm thick is formed by, for example, thermal oxidation.

Figure 4A:
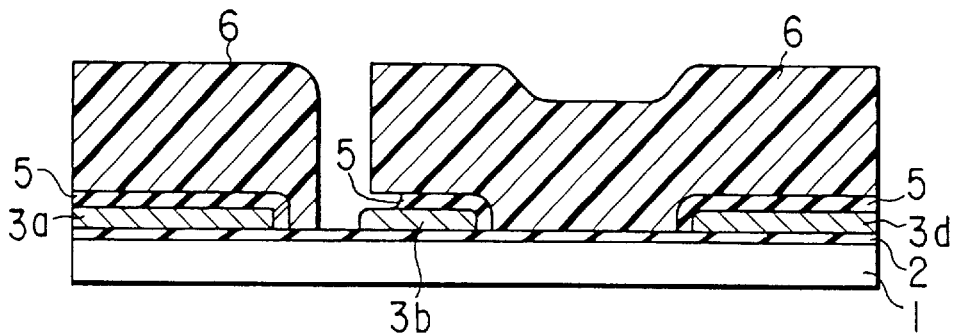
FIGS. 4A and 4B are a sectional view and top view to help explain the method of the manufacturing solid-state imaging device according to the embodiment of the present invention.
Figure 4B:
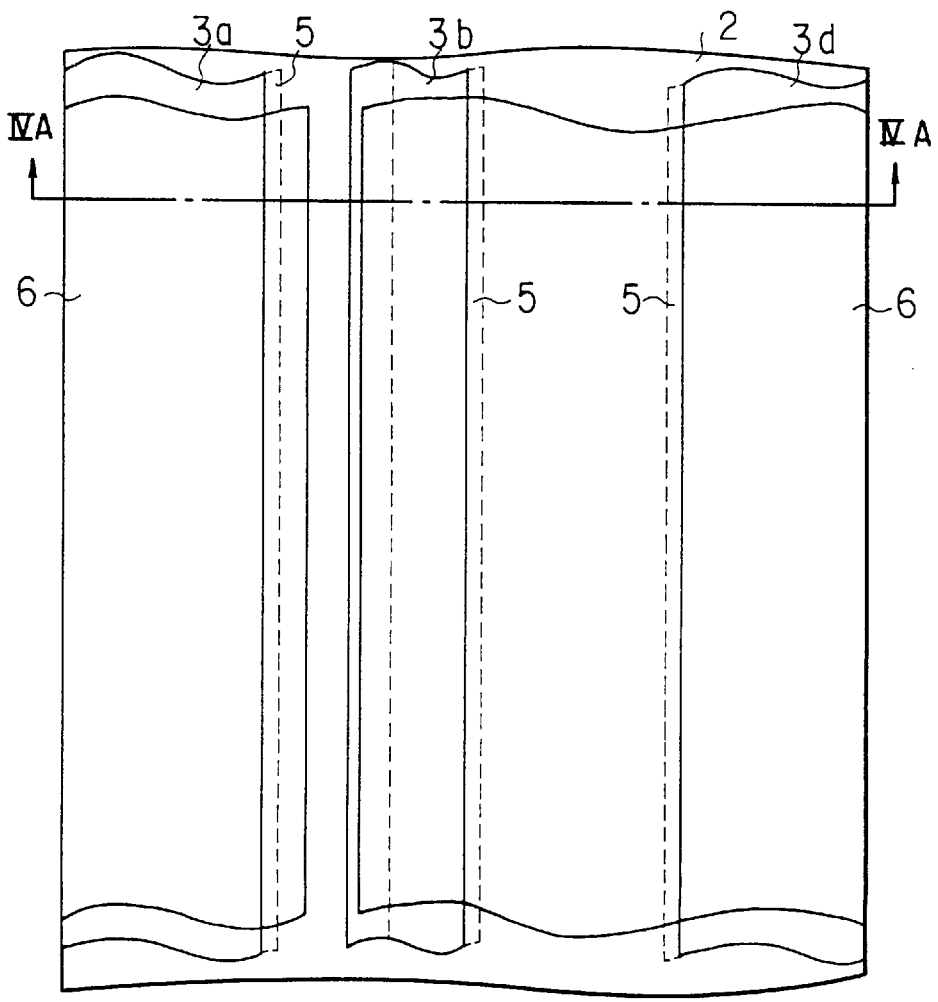
Figure 5A:
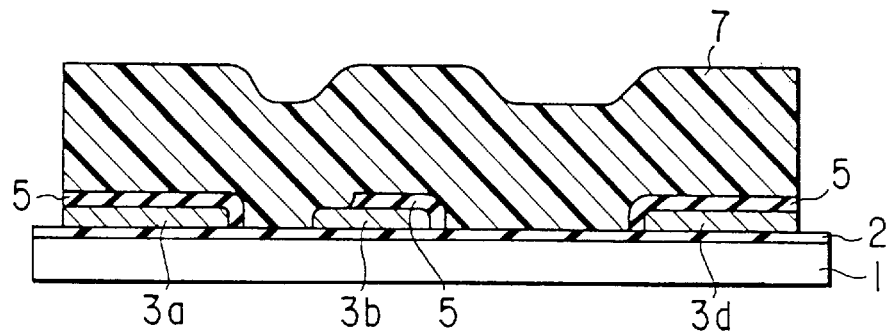
FIGS. 5A and 5B are a sectional view and top view to help explain the method of the manufacturing solid-state imaging device according to the embodiment of the present invention.
Figure 5B:
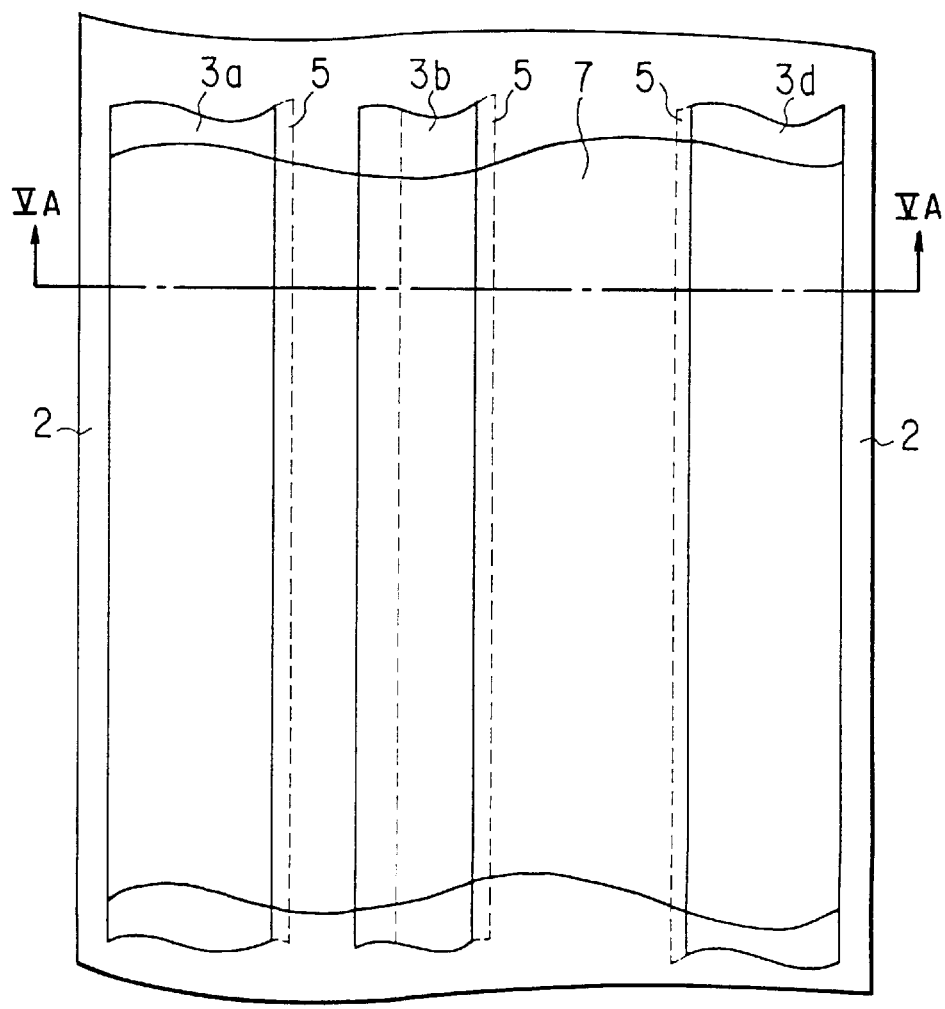

Thereafter, as shown in FIGS. 4A and 4B, a resist film 6 having, for example, a pattern as shown in FIG. 4B is formed so that of the oxide film 5 formed on the sidewall surface of the second charge transfer electrode 3b, that part facing the first charge transfer electrode 3a may be exposed. Next, with the resist film 6 as a mask, the oxide film 5 formed on the sidewall of the second charge transfer electrode 3b is removed by an etching solution, such as $NH_4F$ (FIG. 4B).

Then, to isolate the fourth charge transfer electrode from the first charge transfer electrode, the two adjacent to each other, a resist film 7 having a strip pattern as shown in FIG.

5B is formed. With this resist film as a mask, part of the oxide film 5 on the polysilicon films 3a and 3d and part of the polysilicon films 3a and 3d are removed by etching techniques, such as anisotropic etching. Here, it is desirable that in etching the polysilicon films 3a and 3d, the etching speed of the polysilicon film 3 should be about 20 times as fast as the etching speed of the insulating film constituting the gate insulating film 2, such as an oxide film or a nitride film. With the desirable speed, it is possible to protect the semiconductor substrate 1 with the gate insulating film 2 in etching the polysilicon film 3, thereby preventing the semiconductor substrate 1 from being damaged.

Thereafter, as shown in FIG. 6A, a second layer polysilicon film 8 of, for example, 400 nm to 500 nm thick is formed. Then, as shown in FIG. 6B, on the polysilicon film 8, part of the oxide film 5 on the first layer polysilicon film 3b constituting the second charge transfer electrode is exposed to form a resist film 9 having such a pattern as exposes the space between the first charge transfer electrode 3a and the fourth charge transfer electrode 3d completely.

Next, with the resist film 9 as a mask, the second layer polysilicon film 8 is etched by anisotropic etching techniques to form a part 8b of the second charge transfer electrode and a third charge transfer electrode 8c. By setting the amount of etching to the extent that, for example, a polysilicon film whose thickness is about 1.2 to 1.5 times that of the second polysilicon film 8 is etched, the second layer polysilicon films 8a and 8d are allowed to remain on the sidewalls of the first charge transfer electrode 3a and fourth charge transfer electrode 3d as shown in FIGS. 7A and 7B. Specifically, the distance between the fourth charge transfer electrode and first charge transfer electrode of adjacent cells is determined by the distance between the polysilicon films 8d and 8a remaining on the sidewalls.

Thereafter, to remove the first layer polysilicon film 3 and second layer polysilicon film 8 on the photodiode region 11, a resist film 9 having a pattern as shown in FIG. 8B is formed. Then, with the resist film 9 as a mask, the second layer polysilicon film 8 is removed by, for example, anisotropic etching techniques. It is desirable that in the etching, the etching speed of the polysilicon film should be more than 20 times as fast as the etching speed of the insulating film constituting the gate insulating film 2, such as an oxide film or a nitride film.

Figure 9A:
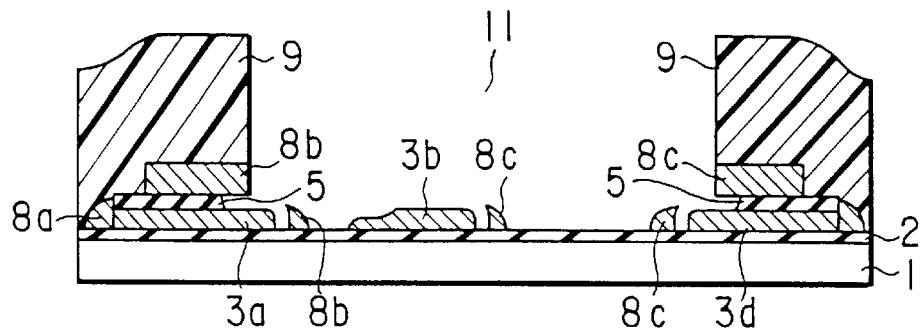
FIGS. 9A and 9B are a sectional view and top view to help explain the method of the manufacturing solid-state imaging device according to the embodiment of the present invention.
Figure 9B:
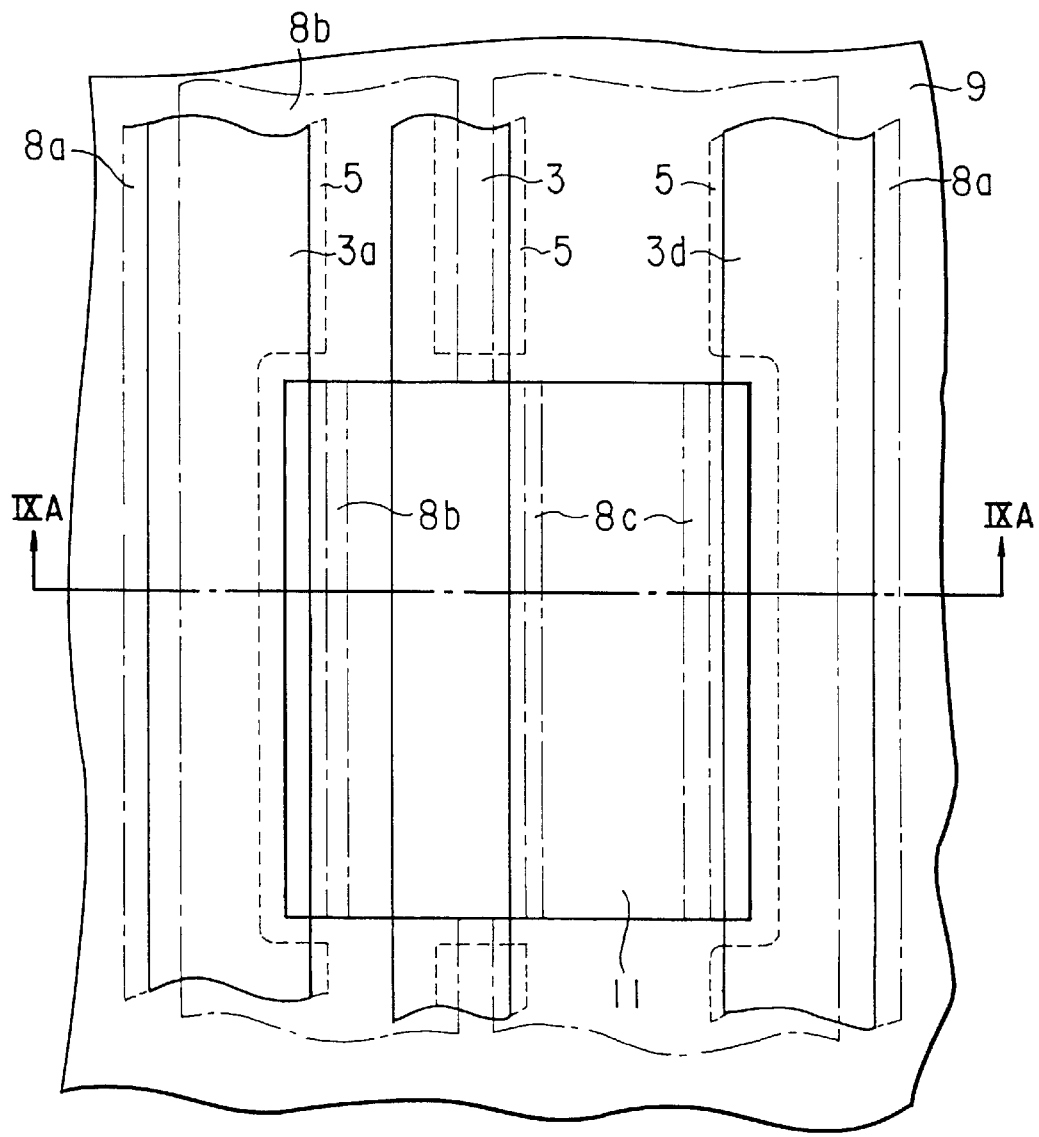

Then, with the resist film 9 as a mask, for example, the thermal oxidation film 5 formed on the first layer polysilicon film is removed by etching techniques using, for example, NH₄F, as shown in FIGS. 9A and 9B. It is desirable that in the etching, the etching speed of the oxide film should be more than 50 times as fast as the etching speed of the insulating film constituting the gate insulating film 2, such as a nitride film.

Then, with the resist film 9 as a mask, the portions exposed in the first layer polysilicon film 3 are removed by, for example, the same method as removing the second layer polysilicon film 8. Thereafter, the resist film 9 is removed to expose the photodiode region 11 as shown FIGS. 10A and 10B. FIGS. 1A to 1C show the state at that time.

Thereafter, a thermal oxidation film 8 is formed on, for example, the second layer polysilicon film 8. Then, a metal film of, for example, Al is formed so as to cover the first and second layer polysilicon films. Then, the metal film on the photodiode region is removed and the first to fourth charge transfer electrodes are covered with the metal film, thereby forming a shading film. This completes the CCD solid-state imaging device.

With the solid-state imaging device manufacturing method of the present embodiment, because the charge transfer electrodes are formed of two layers of polysilicon films, the step heights due to the charge transfer electrodes are reduced as compared with the conventional method where three layers of polysilicon films were used to form four phase charge transfer electrodes, which improves the covering rate of the shading film. This prevents light from entering the portions other than the photodiode and therefore suppresses the generation of erroneous signals.

Furthermore, the present embodiment is characterized by forming each of two layers of polysilicon films composing charge transfer electrodes into a strip pattern and then removing the two layers of polysilicon films on the photodiode region 11 in a single lithography process. This eliminates the necessity of securing a mating margin for each pattern, unlike a case where each layer of polysilicon film is processed using lithographic techniques. As a result, it is possible to subminiaturize cells. When the cell area is set constant, the area of the photodiode region 11 can be increased, improving the sensitivity of the solid-state imaging device.

With the conventional method of forming charge transfer electrodes from three layers of polysilicon films, it was difficult to etch the three layers of polysilicon films and two layers of insulating film between the films using the same resist film formed in the lithography process as a mask, because the resistance of the resist film to etching was not sufficient. With the present embodiment, however, only two layers of polysilicon films and a single layer of insulating film have to be etched. Therefore, the resist film withstands the etching sufficiently, enabling an opening to be made on the photodiode region 11 in a single lithography process.

Furthermore, with the present embodiment, although the second layer polysilicon film is patterned on the patterned first layer polysilicon film, it is not patterned on the gate insulating film 2. As a result, the length of the first to fourth charge transfer electrodes at the interface with the gate insulating film 2 is influenced only by the patterning of the first layer polysilicon film. As described above, because the length of each of the four phase charge transfer electrodes is determined in a single lithography process, it is possible to prevent the length of the charge transfer electrodes from changing due to the misalignment of patterning in processing the individual charge transfer electrodes. Because the length of each charge transfer electrode can always be made constant, the setting of the impurity concentration distribution in the channel region can be done easily. Moreover, because the length of each charge transfer electrode is not influenced by the misalignment of patterning, a burden to the lithography process can be reduced in processing the second layer polysilicon film.

With the present embodiment, after the first layer polysilicon film is processed and then the processed first layer polysilicon film is oxidized thermally to form a thermal oxidation film 5, the second layer polysilicon film is formed. Therefore, the distance between adjacent charge transfer electrodes in a single cell is determined by the thickness of the thermal oxidation film. The distance between the portions in contact with the interface with the gate insulating film 2 is particularly made smaller than the minimum dimension the lithography process will allow. This makes it possible to improve the transfer efficiency of charges.

Furthermore, with the present embodiment, after the first layer polysilicon film is processed to isolate cells from each other, the second layer polysilicon film is formed.

Thereafter, the second layer polysilicon film is processed. Here, by processing the second layer polysilicon film by anisotropic etching techniques, it is possible to cause the second layer polysilicon film to remain on the sidewall of the previously processed first layer polysilicon film. In this way, the distance between cells can be made smaller than the minimum dimension the lithography process will allow. This makes it possible to improve the transfer efficiency of charges.

Still furthermore, by using a stacked layer film including, for example, a nitride film as an insulating film constituting the gate insulating film 2, the semiconductor substrate 1 can be protected in removing the oxide film on the polysilicon film in the photodiode region 11.

Similarly, when the polysilicon film in the photodiode region 11 is removed, the etching speed of the polysilicon film is made more than 20 times as fast as the etching speed of the gate insulating film 2, thereby enabling the gate insulating film 2 to protect the semiconductor substrate 1 in the photodiode region 11.

As described until now, with the solid-state imaging device of the present invention and the method of manufacturing the device, the generation of erroneous signals can be suppressed by reducing the step height between the charge transfer region and the photodiode region, which makes it easy to realize a high density solid-state imaging device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

It is claimed:

1. A solid-state imaging device comprising:
   a plurality of light-receiving elements formed on a semiconductor substrate; and
   a set of four charge transfer electrodes that are formed via a gate insulating film in the regions between the light-receiving elements and that are applied with four different pulse signals, the set of four charge transfer electrodes being arranged repeatedly, wherein
   a first charge transfer electrode and a fourth charge transfer electrode in said set of charge transfer electrodes are made of a first conductive film, a second charge transfer electrode in said set of charge transfer electrodes are made of said first conductive film and a second conductive film, and a third charge transfer electrode in said set of charge transfer electrodes is made of said second conductive film,
   an oxide film formed by thermally oxidizing said first conductive film isolates said first charge transfer electrode from said second charge transfer electrode, said second charge transfer electrode from said third charge transfer electrode, and said third charge transfer electrode from said fourth charge transfer electrode, and
   the end of said second conductive film is located on the said oxide film on said first conductive film.

2. A solid-state imaging device according to claim 1, wherein said first and second conductive films are composed of a polysilicon film.

3. A solid-state imaging device comprising:
   a plurality of light-receiving elements formed on a semiconductor substrate;
   a set of four charge transfer electrodes that are formed via a gate insulating film in the regions between the light-receiving elements and that are applied with four different pulse signals, the set of foul charge transfer electrodes being arranged repeatedly, wherein
   a first charge transfer electrode, a fourth charge transfer electrode, and part of a second charge transfer electrode in said set of charge transfer electrodes are made of a first conductive film,
   a third charge transfer electrode and the remaining portion of said second charge transfer electrode in said set of charge transfer electrodes are made of a second conductive film,
   said first conductive film is joined to said second conductive film in said second charge transfer electrode,
   an oxide film formed by thermally oxidizing said first conductive film isolates said first charge transfer electrode from said second charge transfer electrode, said second charge transfer electrode from said third charge transfer electrode, and said third charge transfer electrode from said fourth charge transfer electrode,
   the end of said second conductive film is located on the said oxide film on said first conductive film;
   a first conductive material portion formed of said second conductive film joined to the sidewall of the first charge transfer electrode in a set of charge transfer electrodes adjacent to said fourth charge transfer electrode; and
   a second conductive material portion formed of said second conductive film joined to the sidewall of the fourth charge transfer electrode in a set of charge transfer electrodes adjacent to said first charge transfer electrode.

4. A solid-state imaging device according to claim 3, wherein said first and second conductive films are composed of a polysilicon film.

* * * * *